United States Patent
Masgras et al.

(10) Patent No.: US 7,603,601 B2
(45) Date of Patent: Oct. 13, 2009

(54) ENABLING SPECIAL MODES WITHIN A DIGITAL DEVICE

(75) Inventors: Cristian P. Masgras, Round Rock, TX (US); Michael Pyska, Phoenix, AZ (US); Edward Brian Boles, Mesa, AZ (US); Joseph W. Triece, Phoenix, AZ (US); Igor Wojewoda, Tempe, AZ (US); Mei-Ling Chen, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 703 days.

(21) Appl. No.: 11/355,619

(22) Filed: Feb. 16, 2006

(65) Prior Publication Data

US 2006/0190791 A1 Aug. 24, 2006

Related U.S. Application Data

(60) Provisional application No. 60/655,955, filed on Feb. 24, 2005.

(51) Int. Cl.
*G01R 31/3185* (2006.01)
(52) U.S. Cl. ..................................... 714/733
(58) Field of Classification Search ................ 714/733, 714/814
See application file for complete search history.

(56) References Cited

U.S. PATENT DOCUMENTS

| | | | | |
|---|---|---|---|---|
| 5,072,137 | A * | 12/1991 | Slemmer | 326/16 |
| 5,983,379 | A * | 11/1999 | Warren | 714/727 |
| 6,316,959 | B1 * | 11/2001 | Onodera | 326/46 |
| 6,526,536 | B1 * | 2/2003 | Chen et al. | 714/738 |
| 6,657,451 | B2 * | 12/2003 | Meli | 324/765 |
| 6,888,765 | B1 * | 5/2005 | Kotowski et al. | 365/201 |
| 7,133,990 | B2 * | 11/2006 | Link et al. | 711/164 |

OTHER PUBLICATIONS

European Communication for 06 735 222.9 dated Nov. 21, 2008.
International Search Report for PCT/US2006/005462 Mailed Oct. 13, 2006.

* cited by examiner

*Primary Examiner*—Stephen M Baker
(74) *Attorney, Agent, or Firm*—King & Spalding LLP

(57) ABSTRACT

A special mode key match comparison module has N-storage elements and a special mode key match comparator. The N-storage elements accumulate a serial data stream, and then determine whether a digital device should operate in a normal user mode, in a public programming mode, or in a particular private test mode. To reduce the possibility of accidentally decoding a false test or programming mode, the data stream has a sufficiently large number of N-bits to substantially reduce the probability of a false decode. To further reduce the possibility of accidentally decoding a programming or test mode, the special mode key match comparison module may be reset if less or more than N-clocks are detected during the accumulation of the N-bit serial data stream. The special mode key match data patterns may represent a normal user mode, a public programming mode, and particular private manufacturer test modes.

29 Claims, 2 Drawing Sheets

ENABLING SPECIAL MODES WITHIN A DIGITAL DEVICE

RELATED PATENT APPLICATION

This application claims priority to commonly owned U.S. Provisional Patent Application Ser. No. 60/655,955; filed Feb. 24, 2005; entitled "Enabling Special Modes Within a Digital Device," by Cris Masgras, Mike Pyska, Brian Boles, Joe Triece, Igor Wojewoda and Mei-Ling Chen; which is hereby incorporated by reference herein for all purposes.

TECHNICAL FIELD

The present disclosure relates to digital devices, more particularly, to enabling special modes, e.g., testing and programming modes, of the digital devices.

BACKGROUND

Historically, digital devices have used detection of high voltage levels (typically 12-15 volts) on a particular input-output (I/O) pin to enable test or programming modes. However, in read only memory (ROM) and smaller geometry flash memory processes, there may not be circuits capable of detecting nor withstanding these high voltages. Typically, specific logic levels defining the testing and/or programming modes are coupled to a number of parallel input-output (I/O) pins of an integrated circuit digital device having a large number of I/O pins available. However for I/O pin constrained digital devices this is not practical or even possible.

SUMMARY

What is needed is a way to enable special modes, e.g., test and/or programming modes, that do not require high voltages, have very low probability of false detection, may be asynchronously reset, and only require a minimum number of I/O pins, e.g., one or two I/O pins.

According to this disclosure, special modes, e.g., test and/or programming modes, in a digital device may be enabled without requiring high voltages, have a very low probability of false detection, may be asynchronously reset, and may require only one or two I/O pins. The digital device may be a microcontroller, microprocessor, digital signal processor, application specific integrated circuit (ASIC), programmable logic array (PLA), and the like.

According to teachings of this disclosure, a clocked serial digital signal, e.g., special coded data stream key, on at least one signal connection, e.g., pin, pad, etc., of a digital device may be received while a special mode enable signal, e.g., a reset or clear, to the digital device is asserted, e.g., held in a reset state. The clocked serial digital signal may comprise clock information and a data stream. The data stream may have, for example but is not limited to, 32 randomly selected bit states. If the data stream contains the correct 32 bit states (logic 1s and 0s), e.g., a mode key, within a correct number of clock pulses, then the digital device may be placed into a special mode, e.g., test or programming mode. However, if the data stream does not present the correct number of bit states within the correct number of clock pulses, e.g., no mode key match, then the special mode request may be rejected and the digital device will remain in a normal operating mode.

When the special mode enable is asserted to the digital device during the assertion of the special mode enable, a special coded data stream key may be recognized as a request for the digital device to go into a special mode, e.g., a program or test mode. The special coded data stream key may be unique for each of the special modes for testing and programming, e.g., there may be a plurality of test modes and at least one programming mode. The special coded data stream key may be synchronous in combination with a certain number of clock pulses on a second I/O (e.g., clock) line. Or the special coded data stream key may be synchronous with a certain number of clock pulses from a self generating clock, e.g., Manchester coding, thus requiring only one I/O connection.

According to a specific example embodiment of this disclosure, an apparatus for enabling special modes within a digital device may comprise N-storage elements having N-outputs, a clock input and a serial data input; the N-storage elements may be adapted to accumulate N-bits of serial data during N-clocks, wherein the N-outputs may be representative of the accumulated N-bits of serial data; a special mode key match comparator may be coupled to the N-outputs of the N-storage elements; the special mode key match comparator may have at least one special mode key match data pattern for at least one special mode of a digital device; and the special mode key match comparator compares the accumulated N-bits of serial data with the at least one special mode key match data pattern, and if the accumulated N-bits of serial data match a one of the at least one special mode key match data pattern then the special mode key match comparator outputs a special mode code representative of the at least one special mode and a special mode active to the digital device.

According to another specific example embodiment of this disclosure, a method for enabling special modes within a digital device may comprise the steps of asserting a special mode enable; accumulating N-bits of serial data during N-clocks; deasserting the special mode enable; comparing special mode data patterns to the accumulated N-bits of serial data, wherein if the accumulated N-bits of serial data match one of the special mode key data patterns then setting the digital device to a special mode associated with the matching special mode data pattern.

According to yet another specific example embodiment of this disclosure, a method for enabling special modes within a digital device may comprise the steps of asserting a special mode enable; clearing N-storage elements; accumulating N-bits of serial data in the N-storage elements during N-clocks; deasserting the special mode enable; comparing special mode data patterns to the accumulated N-bits of serial data in the N-storage elements, wherein if the accumulated N-bits of serial data match one of the special mode key data patterns then setting the digital device to a special mode associated with the matching special mode data pattern.

BRIEF DESCRIPTION OF THE DRAWINGS

A more complete understanding of the present disclosure thereof may be acquired by referring to the following description taken in conjunction with the accompanying drawings wherein.

Figure 1:
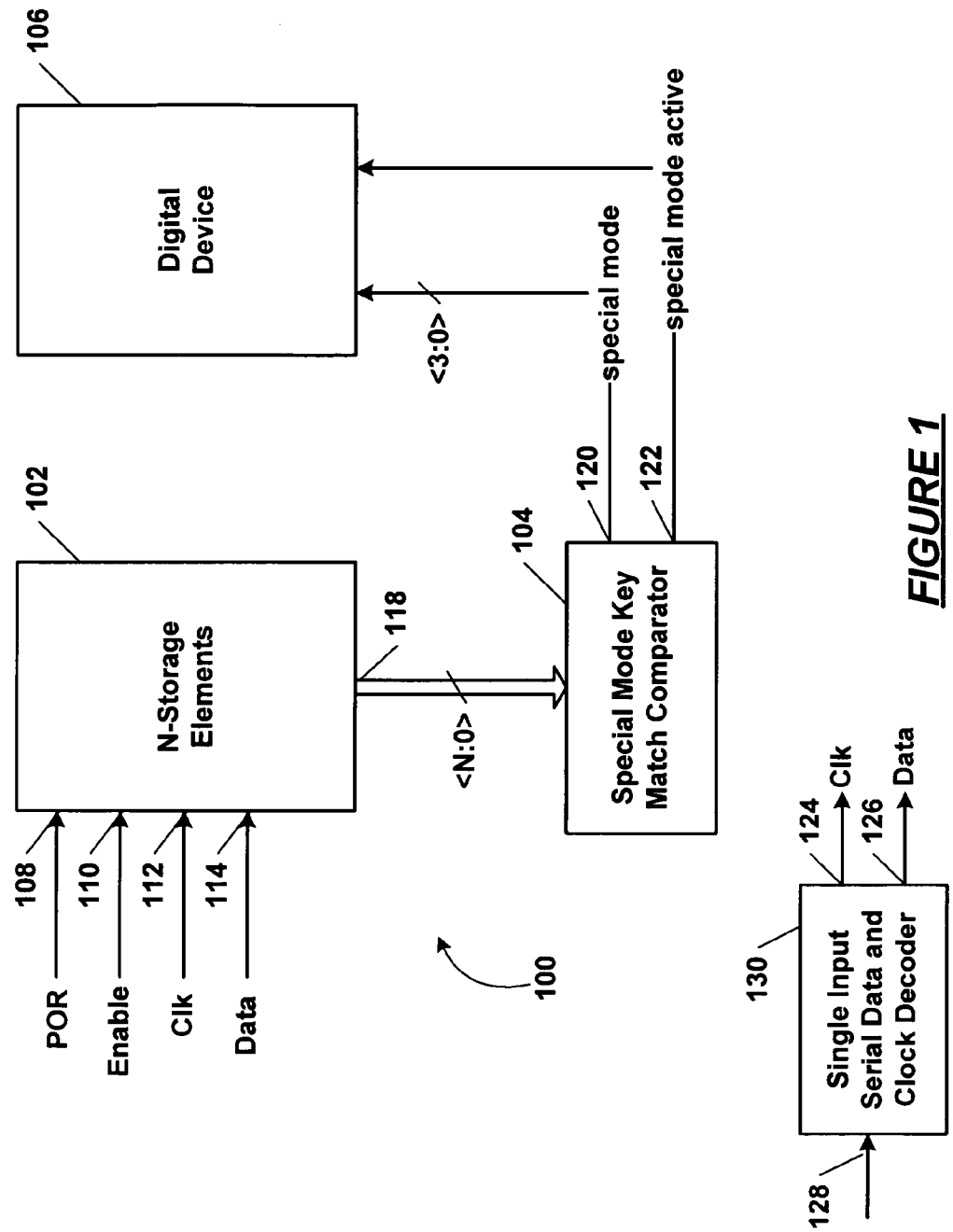
FIG. 1 is a schematic block diagram of a special mode key match comparison module and a digital device, according to a specific example embodiment of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic block diagram of a special mode key match comparison module and a digital device, according to a specific example embodiment of the present disclosure. The special mode key match comparison module, generally represented by the numeral 100, may comprise N-storage elements 102 and a special mode key match comparator 104. The special mode key match comparison module 100 may accumulate a serial data stream while a special mode enable, e.g., enable 110, is asserted, and from this accumulated serial data stream determine if a digital device 106 may operate in either a normal user mode, a public programming mode, or a particular private test mode.

To reduce the possibility of accidentally decoding a false special mode key, the desired data stream may have a sufficiently large number of N-bits, e.g., 32 bits, whereby the probability of a false decode may be greatly reduced. The outputs 118 of the N-storage elements 102 may be parallel and N-bits wide. The special mode key match comparator 104 may compare the N-bit wide parallel outputs 118 with N-bit wide predefined data patterns using combinational (no storage) logic. To further reduce the possibility of accidentally decoding a programming or test mode, the N-storage elements 102 and outputs 118 may be reset if less or more than N-falling clock edges is detected while accumulating the serial data stream. Therefore, an expected serial data pattern (e.g., matching data pattern for either the public programming mode or one of the private test modes) must be received during the N-clocks, otherwise all of the storage elements 102 and outputs 118 may be reset.

These predefined data patterns may represent the normal user mode, the public programming mode and particular private manufacturer test modes. For example, but not limited to, the least significant four bits <3:0> may indicate a user mode, a serial programming mode, and private manufacturer test mode data patterns that may define different test modes at outputs 120.

For an example of the operation of the special mode key match comparison module 100, according to the present disclosure, the following signals may be used: Input 108 may be coupled to a macro reset signal, e.g., a power-on-reset of the digital device 106. Input 110 may be coupled to an asynchronous signal, e.g., "special mode enable," that may indicate when clock and data patterns are to be evaluated. Input 112 may be coupled to macro data clock, e.g., "Clk." Input 114 may be coupled to the incoming macro serial data, e.g., "Data." Outputs 118 may be the stored N-bits of serial data received by the N-storage elements 102 during N-clocks. The stored N-bits of serial data may be compared with the data patterns for either the public programming mode or one of the private test modes in the special mode key match comparator 104 and when a match occurs the outputs 120, e.g., "test mode" indicate the desired device operational mode, e.g., 0000=a user mode, 1111=serial programming mode (may be forced on public key match), and 0001-1110=test modes 1-14. Output 122, e.g., "special mode active" may indicate that there has been a public key match (serial programming enabled) or a private key match for the indicated test mode on outputs 120 and that the enable 110 has been deasserted, indicating that the clock and data patterns had been expected, e.g., the bit patterns on outputs 120 are valid and the digital device 106 should go into the indicated programming or test mode. It is contemplated and within the scope of this disclosure that N may be any positive integer value and that the outputs 120 may be any positive integer number less than N.

The outputs 118 may be reset to a known value, e.g., logic "0s," or logic "1s" or inactive, whenever input 108 (POR) is asserted. When the enable 110 is asserted, the N-storage elements 102 may be reset to a known value, e.g., logic "0s," or logic "1s", e.g., by triggering a one-shot. The N-storage elements 102 may also be reset to a known value upon receiving a thirty-third falling edge clock (for 32 bit key) on the input 112 (Clk) during detection of a received serial data pattern, e.g., special mode key bit pattern was detected during an incorrect number of clock pulses.

A single input serial data and clock decoder 130 may be used to receive serial data having self generating clocks, e.g., Manchester coding, thus requiring only one I/O package connection. The single input serial data and clock decoder 130 may receive the serial data having self generating clocks and then generate serial data (e.g., data) on output 126 and the associated clock signal (e.g., clk) on output 124. Outputs 124 and 126 may be coupled to inputs 112 and 114, respectively, of the N-storage elements 102. The special mode key match comparison module 100 may be put into a sleep mode by another sleep mode input (not shown) wherein the outputs 118 may be held in a predefined logic state or a high impedance state (e.g., tri-state) and/or the outputs 120 and 122 may be held in a predefined logic state or a high impedance state (e.g., tri-state) so as to reduce power consumption and/or affect operation of the digital device 106.

Figure 2:
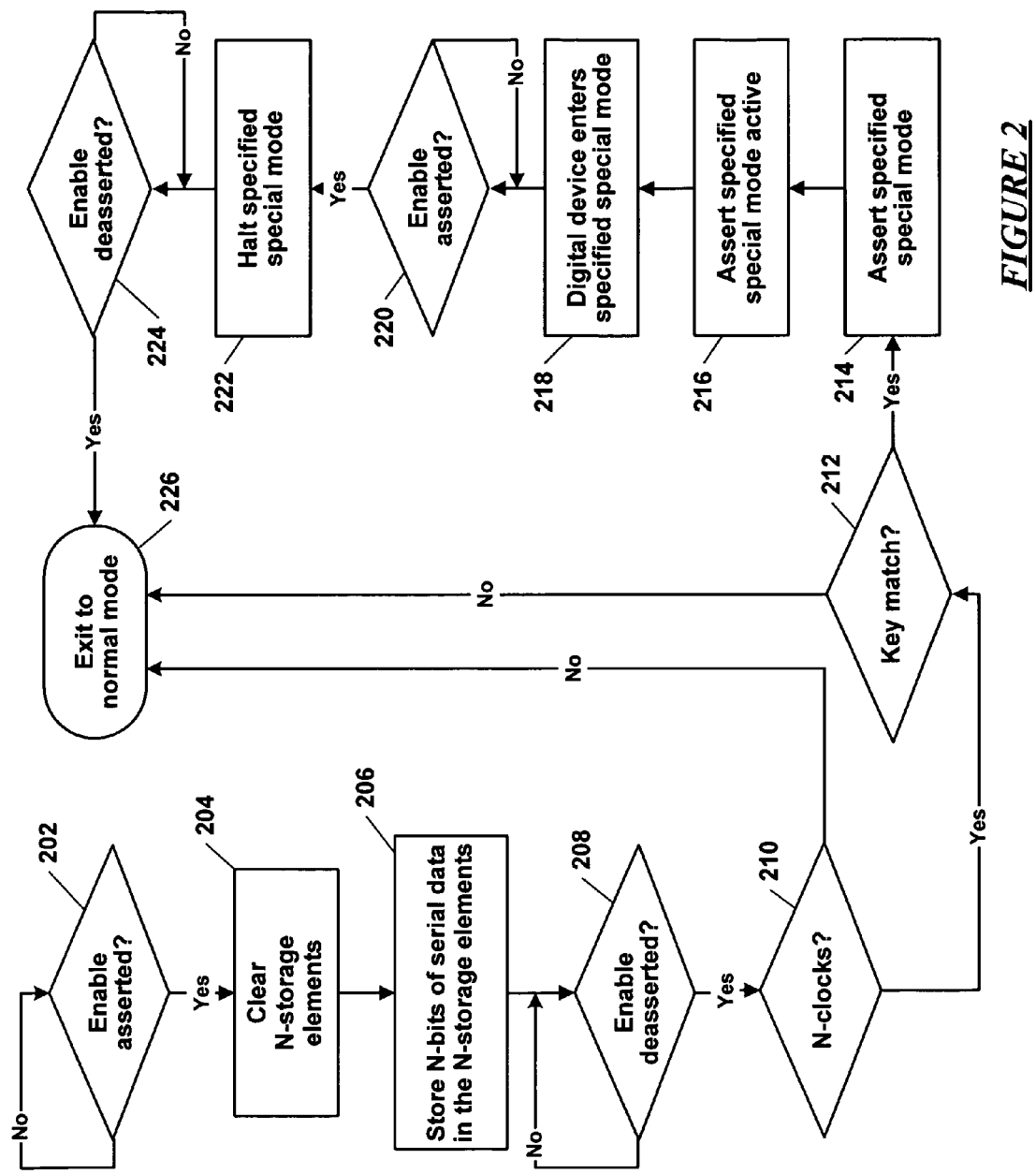
FIG. 2 is a schematic flow diagram of a sequence of steps in determining key match patterns for placing the digital device into a special mode for programming or testing, according to a specific example embodiment of the present disclosure.

Referring now to FIG. 2, depicted is a sequence of steps in determining key match patterns for placing the digital device into a special mode for programming or testing, according to a specific example embodiment of the present disclosure. Step 202 determines when a special mode enable (e.g., enable 110) is asserted. When step 202 determines that the special mode enable has been asserted, step 204 will clear the N-storage elements (e.g., N-storage elements 102). While the special mode enable is asserted, N-bits of serial data (e.g., Data 114) are stored, e.g., in the N-storage elements 102. Step 208 determines when the special mode enable is deasserted, and then step 210 determines if the N-bits of serial data were received during N-clocks (e.g., Clk 112).

If step 210 determines that the N-bits of serial data were not received during N-clocks, e.g., more or less than N-clocks, then in step 226 an exit to normal mode is made, e.g., the digital device 106 remains in normal operation. If the N-bits of serial data were received during N-clocks then step 212 determines if there is a special mode key match with the received N-bits of serial data, e.g., stored in the N-storage elements 102. If step 226 finds no key match then an exit to normal mode is made, e.g., the digital device 106 remains in normal operation. If there is a key match determined in step 212 then in step 214 the respective special mode, e.g., programming mode or one of the test modes, is asserted to the digital device. In step 216 the asserted (specified) special mode from step 214 may be activated, and in step 218 the digital device 106 may then enter operation of the specified special mode.

The digital device may remain operating in the specified special mode until step 220 determines that the special mode enable has again been asserted. Once step 220 determines assertion of the special mode enable, then in step 222 the digital device halts operation of the specified special mode. Step 224 determines when the special mode enable is deasserted, then after the special mode enable has been deasserted the digital device 106 resumes normal mode operation in step 226.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for enabling special modes within a digital device, comprising:
   N-storage elements having N-outputs, a clock input and a serial data input;
   the N-storage elements are adapted to accumulate N-bits of serial data during N-clocks, wherein the N-outputs being representative of the accumulated N-bits of serial data;
   a special mode key match comparator coupled to the N-outputs of the N-storage elements;
   the special mode key match comparator has at least one special mode key match data pattern for at least one special mode of a digital device; and
   the special mode key match comparator compares the accumulated N-bits of serial data with the at least one special mode key match data pattern, and if the accumulated N-bits of serial data match a one of the at least one special mode key match data pattern then the special mode key match comparator outputs a special mode code representative of the at least one special mode and a special mode active to the digital device.

2. The apparatus according to claim 1, wherein the at least one special mode is at least one programming mode.

3. The apparatus according to claim 1, wherein the at least one special mode is at least one test mode.

4. The apparatus according to claim 1, wherein N is equal to 32.

5. The apparatus according to claim 1, wherein N is equal to $2^n$, where n is a positive integer number.

6. The apparatus according to claim 1, wherein if the N-bits of serial data accumulate in more than N-clocks then the N-storage elements are cleared and no special mode code is output to the digital device.

7. The apparatus according to claim 1, wherein if the N-bits of serial data accumulate in more than N-clocks then the N-storage elements are cleared and no special mode active is output to the digital device.

8. The apparatus according to claim 1, wherein if the N-bits of serial data accumulate in less than N-clocks then the N-storage elements are cleared and no special mode code is output to the digital device.

9. The apparatus according to claim 1, wherein if the N-bits of serial data accumulate in less than N-clocks then the N-storage elements are cleared and no special mode active is output to the digital device.

10. The apparatus according to claim 1, wherein the special mode code is less than N-bits.

11. The apparatus according to claim 1, wherein the digital device is a microcontroller.

12. The apparatus according to claim 1, wherein the digital device is selected from the group consisting of a microprocessor, a digital signal processor (DSP), application specific integrated circuit (ASIC), and programmable logic array (PLA).

13. The apparatus according to claim 1, further comprising a power-on-reset (POR) input to the N-storage elements, wherein the N-storage elements are cleared when the POR is asserted.

14. The pattern detection apparatus according to claim 1, further comprising a special mode enable input to the N-storage elements for enabling operation thereof.

15. The pattern detection apparatus according to claim 1, further comprising a single input serial data and clock decoder having a single serial input, and data and clock outputs, wherein the data and clock outputs are connected to the serial data and clock inputs, respectively, of the N-storage elements.

16. A method for enabling special modes within a digital device, said method comprising the steps of:
    asserting a special mode enable;
    accumulating N-bits of serial data during N-clocks;
    deasserting the special mode enable;
    comparing special mode data patterns to the accumulated N-bits of serial data, wherein if the accumulated N-bits of serial data match one of the special mode key data patterns then setting the digital device to a special mode associated with the matching special mode data pattern.

17. The method according to claim 16, wherein the step of setting the digital device to the special mode comprises the steps of asserting a specified special mode and asserting a specified special mode active to the digital device.

18. The method according to claim 16, wherein N is equal to 32.

19. The method according to claim 16, wherein N is equal to $2^n$, where n is a positive integer number.

20. The method according to claim 16, wherein the digital device is a microcontroller.

21. The method according to claim 16, wherein the digital device is selected from the group consisting of a microprocessor, a digital signal processor (DSP), application specific integrated circuit (ASIC), and programmable logic array (PLA).

22. The method according to claim 16, further comprising the step of determining if the accumulated N-bits of serial data occurred in N-clocks.

23. The method according to claim 22, wherein if the accumulated N-bits of serial data did not occur in N-clocks, then not setting the digital device to the special mode.

24. The method according to claim 16, further comprising the step of asserting the special mode enable after setting the digital device to the special mode, wherein the digital device stops operation of the special mode.

25. The method according to claim 24, further comprising the step of deasserting the special mode enable after the digital device stops operation of the special mode, wherein the digital device resumes normal mode operation.

26. A method for enabling special modes within a digital device, said method comprising the steps of:
    asserting a special mode enable;
    clearing N-storage elements;
    accumulating N-bits of serial data in the N-storage elements during N-clocks;
    deasserting the special mode enable;

comparing special mode data patterns to the accumulated N-bits of serial data in the N-storage elements, wherein if the accumulated N-bits of serial data match one of the special mode key data patterns then setting the digital device to a special mode associated with the matching special mode data pattern.

27. The method according to claim 26, wherein the step of setting the digital device to the special mode comprises the steps of asserting a specified special mode and asserting a specified special mode active to the digital device.

28. The method according to claim 26, further comprising the step of determining if the accumulated N-bits of serial data occurred in N-clocks.

29. The method according to claim 28, wherein if the accumulated N-bits of serial data did not occur in N-clocks, then not setting the digital device to the special mode.

* * * * *